United States Patent [19]
Herr

[11] Patent Number: 6,154,044
[45] Date of Patent: Nov. 28, 2000

[54] SUPERCONDUCTIVE LOGIC GATE AND RANDOM ACCESS MEMORY

[75] Inventor: Quentin P. Herr, Torrance, Calif.

[73] Assignee: TRW Inc., Redondo Beach, Calif.

[21] Appl. No.: 09/196,791

[22] Filed: Nov. 20, 1998

[51] Int. Cl.[7] .................. H03K 19/195; H03K 19/20; H03K 17/92

[52] U.S. Cl. .............. 326/1; 326/104; 327/367

[58] Field of Search .................. 326/1–7, 104; 327/186, 367, 528; 365/162; 505/190, 170, 234

[56] References Cited

U.S. PATENT DOCUMENTS

| | | | |
|---|---|---|---|
| 4,496,854 | 1/1985 | Chi et al. | 326/5 |
| 5,051,627 | 9/1991 | Schneier et al. | 326/4 |
| 5,233,245 | 8/1993 | Suzuki | 307/476 |
| 5,365,476 | 11/1994 | Mukhanov | 365/162 |

OTHER PUBLICATIONS

*IEEE Transactions on Applied Superconductivity*, vol. 3, No. 1, Mar. 1993, by David A. Feld et al, entitled "A 5–32 Bit Decoder for Application in a Crossbar Switch", pp. 2671–2674.

*Primary Examiner*—Michael Tokar
*Assistant Examiner*—James H. Cho
*Attorney, Agent, or Firm*—Michael S. Yatsko

[57] ABSTRACT

The present invention is a superconductive logic gate assembly (50, 100), a superconductive NOR gate assembly (10), and a superconductive random access memory (150). A superconductive logic gate assembly in accordance with the invention includes a plurality of logic inputs (INPUTS 1–N) each logic input being coupled to a SQUID (16) and each SQUID including at least one resistance (22) which eliminates hysteresis in an output of the SQUID produced in responding to a change in signal level at the logic inputs to the SQUID, a DC bias (20) coupled to each SQUID, and an output circuit (14) coupled to each SQUID for providing a logic output (OUTPUT) in response to the logic inputs.

24 Claims, 5 Drawing Sheets

SUPERCONDUCTIVE LOGIC GATE AND RANDOM ACCESS MEMORY

STATEMENT REGARDING FEDERALLY SPONSORED DEVELOPMENT

This invention was made with Government support under Contract No. F04606-95-D-0069 awarded by the Department of the Air Force. The Government has certain rights in this invention.

BACKGROUND OF THE INVENTION

The present invention relates to superconductive logic gates and more specifically to superconductive logic gates utilizing Josephson junctions and applications thereof.

FIELD OF THE INVENTION

Superconductive logic gate assemblies are well known. Superconductive logic gate assemblies have been developed using superconductivity quantum interference devices (SQUID) which utilize a parallel combination of two or more Josephson junctions which are connected together by an inductor.

Random access memories based upon superconductive Josephson junctions have been made. These memories require row and column address decoders which are the greatest consumer of power as a result of the decoder being in an active state during memory operation. The decoders which have been used in these superconductive applications are based upon latching logic driven by a microwave frequency clock. The decoders of the most optimized designs for a sizable memory (1 MB) require prohibitive power consumption.

A NOR logic gate assembly using SQUIDs is disclosed in the publication entitled "A 5-32 Bit Decoder for Application in a Crossbar Switch" at pps. 2671–2674, Vol. 3, No. 1, March 1993, IEEE Transactions on Applied Superconductivity. The SQUID NOR gate assembly requires the gate to be reset by turning off the gate current $I_{gate}$ with an AC clock. The resetting of the SQUIDs, which detect memory address signals, must be synchronous with the input data rate of the address signals. The utilization of an AC clock for resetting SQUIDs adds complexity to the design of SQUID based logic circuits. Additionally, AC bias can cause undesired circuit resonances dependent upon the inductance and capacitance of the SQUID as discussed in the aforementioned publication.

U.S. Pat. No. 5,233,244 discloses a Josephson logic gate which utilizes the aforementioned AC bias to reset the individual SQUIDs.

SUMMARY OF THE INVENTION

The present invention is a superconductive logic gate assembly which permits the implementation of various logic functions including, but not limited to, NOR logic. The superconductive logic gate assembly, when configured as an NOR gate, has applications permitting its use in a superconductive random access memory as a row address decoder and column address decoder.

The present invention applies a DC bias to SQUIDs connected in series. The use of a single power lead for applying the DC bias simplifies the topology of an integrated circuit superconductive logic gate assembly in accordance with the present invention by making additional area available for the memory array. At least one damping resistor, which preferably provides critical damping to each SQUID, performs the function of resetting the SQUID to respond to the input of logic levels. Each damping resistor eliminates hysteresis in SQUIDs which latch logic states that in the prior art required an AC bias. The present invention provides asynchronous operation relative to the input data rate with no synchronization being required between the data input rate and resetting of the SQUIDs. The at least one damping resistor coupled across the SQUIDs dissipates stored energy making resetting at a clock rate synchronous with the input data rate unnecessary. Preferably, a damping resistor is coupled in parallel to each of the Josephson junctions of each SQUID.

The present invention operates as a superconductive logic gate assembly at refrigerated temperatures, such as 10 EK at which Josephson junctions are operated in a superconductive state.

A superconductive Josephson random access memory in accordance with the invention has subnanosecond access time, cryogenic operation and zero power dissipation in a holding state. The NOR gate assembly in accordance with the invention functions as the row and address decoder of the random access memory which has a highly desirable low power consumption during memory operation.

The superconductive Josephson junction superconductive random access memory of the present invention eliminates the latching logic of prior art superconductive random access memories. The present invention permits a large 1 MB superconductive random access memory to be possible which does not have prohibitive power consumption.

Additionally, logic circuits in accordance with the present invention may be connected with their output circuits in series with the DC power supply which permits current to be recycled from one logic circuit to the next which results in negligible total current consumption. This also eliminates isolation resistors.

The present invention further isolates the logic function from the amplifier output section which both utilize SQUIDs. The resultant separation of logic and output functions facilitates power amplification of the logic output and permits an array of gates to have their outputs powered in series with a single connection to the DC power supply.

While a preferred embodiment of a logic gate assembly in accordance with the invention is a NOR gate, it should be understood that other logic functions may be implemented by the suitable choice of inverters either in the input or outputs.

A superconductive logic gate assembly in accordance with the invention includes a plurality of logic inputs, each logic input being coupled to a SQUID and each SQUID including a resistance which eliminates hysteresis in an output of the SQUID produced in responding to a change in signal level at the logic inputs to the SQUIDs; a DC bias coupled to each SQUID; and an output circuit coupled to each SQUID for providing a logic output in response to the logic inputs. Each logic input is coupled to a transformer through which electrical current flows between the logic input and a reference potential with the transformer coupling the input to the SQUID. Each transformer has a winding within the SQUID and the resistance in each SQUID is preferably at least one resistor coupled to the winding and to Josephson junctions in the SQUID. Each resistor is coupled in a series circuit between the DC bias and the output circuit. The output circuit comprises at least one output SQUID coupled between the DC bias and a reference potential with the at least one output SQUID including an output resistance which eliminates hysteresis in the logic output produced in response to a change in signal level at an input to the at least one output SQUID. Each SQUID is preferably critically damped by the resistance or at least one resistor in responding to a change in signal level at a logic input to the SQUID. The output resistance is preferably a resistor coupled between the DC bias and a reference potential and which provides critical damping in responding to a change in signal level at the input to the output SQUID.

A superconductive logic gate assembly in accordance with the invention includes a plurality of logic inputs coupled to a logic gate circuit which, in response to logic input signals, provides a logic output signal; a DC bias coupled to the logic gate circuit; and wherein the output circuit includes a logic output which provides the logic output signal, the output circuit including at least one output SQUID coupled between the DC bias and a reference potential with the at least one output SQUID including an output resistance which eliminates hysteresis in the logic output signal produced in responding to a change in the signal level at an input to the at least one output SQUID. The output resistance is preferably at least one resistor coupled between the DC bias and the reference potential and preferably provides critical damping in responding to the change in signal level at the input to the at least one output SQUID.

A superconductive logic gate assembly in accordance with the invention includes a plurality of first logic inputs coupled to a first logic gate circuit and a first output circuit coupled to the first logic gate circuit which, in response to first logic input signals, provides a first logic output signal; a plurality of second logic inputs coupled to a second logic gate and a second output circuit coupled to the second logic gate circuit which, in response to second logic input signals applied to the second logic gate circuit, provides a second logic output signal; a DC bias coupled to the first and second logic gate circuits; the first and second logic gate circuits each including a logic output which provides respectively, the first and second logic output signals, the first and second logic gate circuits each including at least one output SQUID coupled between the DC bias and a reference potential with each output SQUID including an output resistance which eliminates hysteresis in the logic output signal produced in response to a change in signal level at an input to the output SQUID; and wherein the output SQUIDs are coupled between the DC bias and the reference potential. Each output resistance is preferably a resistor coupled between the DC bias and the reference potential and which preferably provides critical damping in response to a change in signal level at the input to each SQUID. The output signal of the first and second logic output circuits is respectively a NOR function of the first and second plurality of logic inputs.

A superconductive NOR gate assembly in accordance with the invention includes a plurality of logic inputs, each logic input being coupled to an input SQUID and each input SQUID including an input resistance which eliminates hysteresis in an output of the input SQUID produced in responding to a change in logic level at the logic input to the input SQUID; a DC bias coupled to each input SQUID; each logic input being coupled to a transformer including a winding in a different input SQUID with the winding being coupled to the DC bias; the input resistance of each input SQUID being coupled between the winding and a junction between at least two Josephson junctions with each resistance being coupled in a series circuit; and an output circuit, the output circuit being coupled to the DC bias for producing an output signal which is a NOR function of the plurality of logic inputs and having at least one output SQUID coupled between the DC bias and a reference potential with the output SQUID including at least one output resistance which eliminates hysteresis in the output signal produced in response to a change in signal level at the input to the output SQUID. The input and output resistances are respectively preferably at least one input and at least one output resistor with the at least one input resistor being coupled between the winding and the at least two Josephson junctions in each input SQUID and the at least one output resistor being coupled to the input resistors and to the DC bias the output SQUID.

A superconductive random access memory in accordance with the invention includes a row address decoder which converts row address signals into row select signals for selecting a row to be addressed in the random access memory; a column address decoder which converts column address signals into column select signals for selecting a column to be addressed in the random access memory; a random access memory array coupled to the row and column address decoders which includes memory addresses addressed by the row and column select signals; and wherein the row and address decoder each comprises a superconductive NOR gate assembly including a plurality of address inputs which receive the address signals, each address input being coupled to an input SQUID and each input SQUID including an input resistance which eliminates hysteresis in an output of the input SQUID produced in responding to a change in logic level at the logic input to the input SQUID; a DC bias coupled to each input SQUID; each address input being coupled to a transformer including a winding in a different input SQUID with the winding being coupled to the DC bias; the input resistance of each input SQUID being coupled between the winding and a junction between at least two Josephson junctions with each resistance being coupled in a series circuit; and an output circuit, the output circuit being coupled to the DC bias for producing the output select signal which is a NOR function of the plurality of address inputs and having at least one output SQUID coupled between the DC bias and a reference potential with the at least one output SQUID including an output resistance which eliminates hysteresis in the output select signal produced in response to a change in signal level at an input to the at least one output SQUID. The input and output resistances are preferably respectively at least one input and at least one output resistor with the input resistors being coupled between the winding and at least two Josephson junctions in each input SQUID and the at least one output resistor being coupled to the input resistors and to the DC bias.

BRIEF DESCRIPTION OF DRAWINGS

Like reference numerals identify like parts throughout the drawings.

DETAILED DESCRIPTION OF THE INVENTION

Figure 1A:
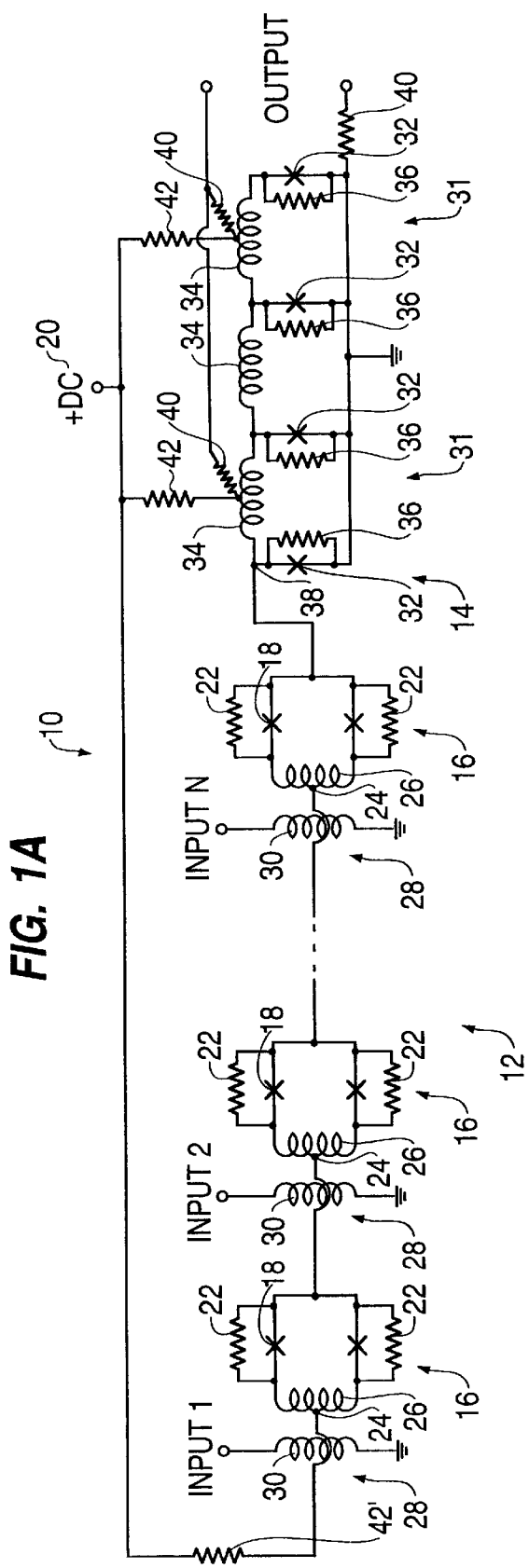
FIG. 1A illustrates a preferred embodiment of a superconductive NOR gate assembly in accordance with the present invention and FIG. 1B illustrates an alternative embodiment.

FIG. 1A illustrates a superconductive NOR gate assembly in accordance with the present invention which has a preferred application as a row and column address decoder in a superconductive random access memory as described below in conjunction with FIG. 4. A similar application is a row and column address decoder in a superconductive crossbar switch. The NOR gate assembly 10 is comprised of a logic gate circuit 12 which is responsive to INPUTS 1–N and an output circuit 14 which provides the OUTPUT in response to the INPUTS 1–N. The logic gate assembly includes a plurality of SQUIDs 16. Each SQUID 16 contains at least two Josephson junction devices 18 which operate in response to the INPUTS 1–N to hold two signal states. The first signal state, when the input is at a low voltage level while a DC bias is applied from DC power supply 20 through resistor 42' by a single line, causes the Josephson junction devices 18 to be switched to a zero resistance state when refrigerated to superconducting temperatures, such as 10 E Kelvin. The second signal state, when the input is at a high voltage level while the DC bias is applied from power supply 20, causes the Josephson junction devices to be switched to a high level resistive state.

The SQUIDs 16 exhibit no hysteresis in response to changed input logic level states as a result of a resistance which damps each SQUID 16. The resistance is preferably a pair of resistors 22, which are individually coupled to each of Josephson junction devices 18 and to an end of a secondary winding 26 of transformer 28. The INPUTS 1–N are respectively coupled to the primary 30 of different transformers 28. The primary 30 of each transformer 28 is magnetically linked to the secondary 26 which applies the input signal of each of the INPUTS 1–N to the Josephson junction devices 18 of the different SQUIDS 16.

Each resistor 22 provides damping, which is preferably critical damping, to its associated SQUID 16. The critical damping dissipates stored magnetic energy caused by the application of an input signal which drives the Josephson junction device to the zero or the high resistive state. The resultant dissipation of stored energy by each resistor 22 makes it possible to utilize a DC power supply 20 instead of the AC power supplies of the prior art which, as stated above, function as clock circuits which have the disadvantage of both complexity and potential resonance conditions. Each of the resistances 22 are connected in a series circuit between the DC power supply 20 and the output circuit 14.

The operation of the SQUIDs 16 is to respond to the logic input signal to drive the SQUID either into the low zero resistance state when the input signal level is at a low voltage or the high resistance state when the input signal is at a high voltage level. As is apparent, when the input signal to any one of the SQUIDs 16 is low, the resistors 22 in each SQUID are bypassed by the zero resistance state of the Josephson junctions 18 which results in less of the DC power supply potential being dropped across the series circuit containing the resistors 22. On the other hand, when the input signal is high, the individual Josephson junction devices 18 are all in a high resistive state which results in more of the DC power potential being dropped across the series circuit containing the resistors 22 in the various serially connected SQUIDs 16.

The output circuit 14 provides output signal amplification which results in the output being an amplified version of the logic output signal preferably having a gain of at least one. The output circuit 14 includes a pair of output SQUIDs 31 which each include at least a pair of Josephson junction devices 32 which are coupled between around and an end of inductor 34. The pair of SQUIDs provide increased output gain over the gain obtained with a single SQUID. The output circuit includes a damping resistance which is preferably resistors 36 which are coupled in parallel to each associated Josephson device. The SQUIDs 32 have the same operational performance as the SQUIDs 18 in that they are conductive in response to a low input signal level from the logic gate circuit and resistive in response to a high input signal level. Damping resistors 36 perform the same function as the resistors 22 in the input SQUIDs and eliminate hysteresis in the output SQUID 30 in the logic CUTPUT produced in response to a change in signal level at an INPUT 38 to the output SQUID. The OUTPUT is coupled across the output SQUIDs 31 and is dropped across output resistors 40. An additional resistor 42 divides the voltage drop across the DC power supply 20 and the output SQUID 30 depending upon the conductive state of the Josephson junction devices 32.

The operation of the NOR gate 10 in FIG. 1 in response to input signals applied to INPUTS 1–N is as follows. When all of the INPUTS 1–N are at a low level, each of the Josephson junction devices 18 is conductive causing all of the voltage potential of the DC power supply to be applied to the output SQUID 31. This causes the Josephson junction devices 32 to be in a resistive state resulting in a high level signal OUTPUT because of the voltage drop across the OUTPUT being substantially across the output SQUIDs 31. This represents the condition under which a high level signal OUTPUT is produced in a NOR gate, namely, when all of the inputs are low. However, when one or more of the input signals applied to INPUTS 1–N is high, the Josephson junction devices 18 of one or more of the SQUIDs 16 are driven into a resistive state which drops the DC potential of the DC power supply 20 across one or more of the SQUIDs which lowers the signal level applied to input 38 causing the output SQUIDs 31 to become conductive resulting in the output signal going low which is representative of a NOR function when anyone of the input signals on INPUTS 1–N is high.

Figure 1B:
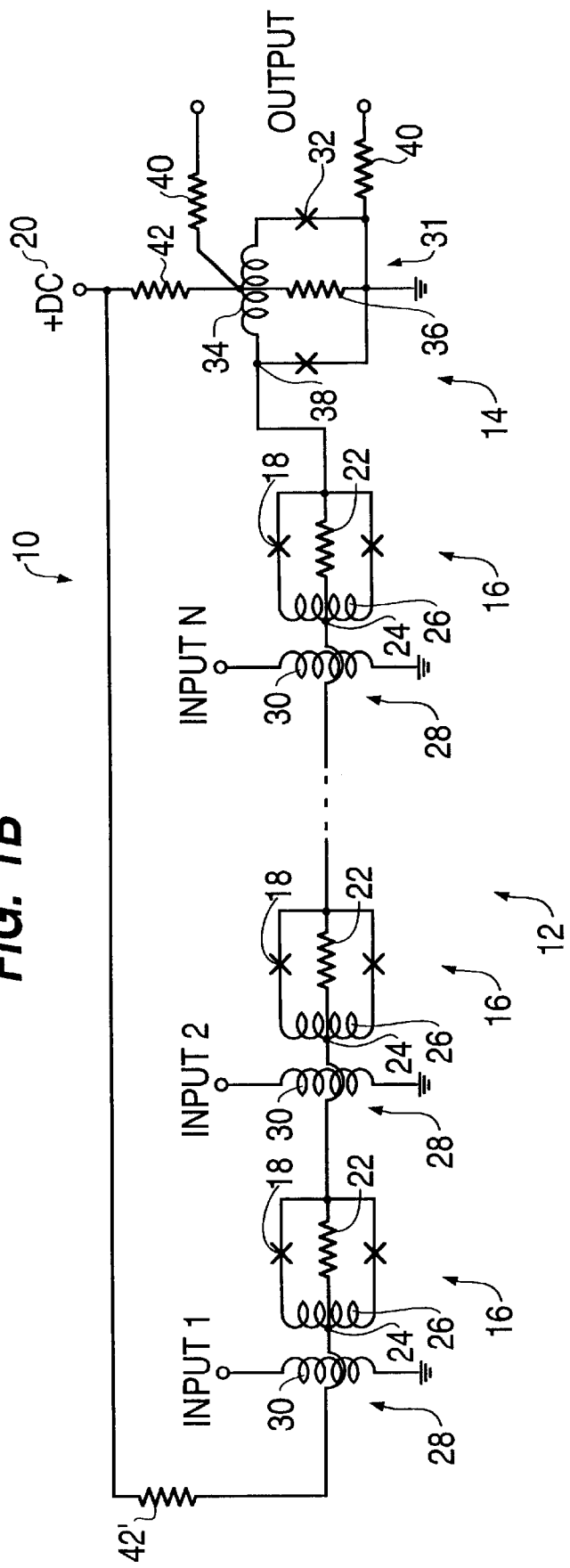

FIG. 1B illustrates an alternative embodiment which differs from the embodiment of FIG. 1A in two aspects. First, only a single resistance is coupled to the pair of Josephson junctions 18 of each SQUIDs 16. Second, only a single output SQUID 31 is used which provides less gain. While this embodiment is not preferred, it should be understood that the invention may be practiced with either the embodiments of FIG. 1A or 1B.

Figure 2:
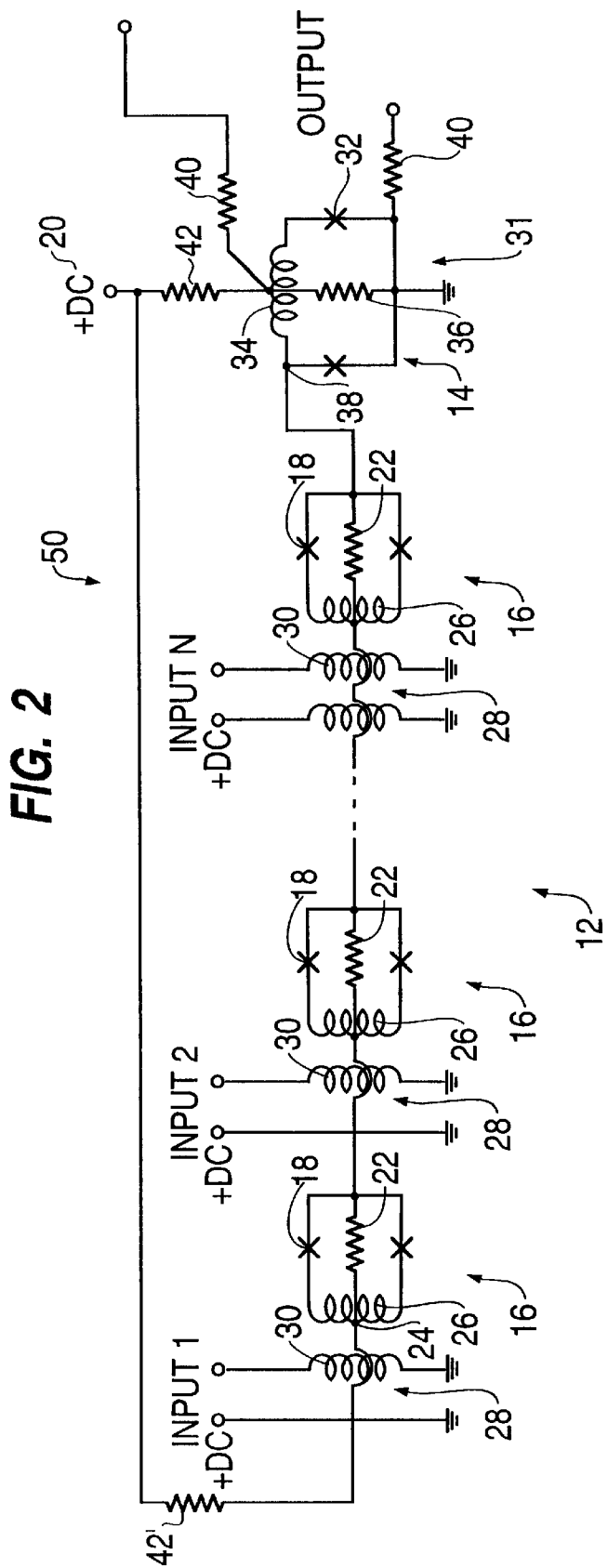
FIG. 2 illustrates a circuit schematic of a superconductive logic gate assembly in accordance with the invention which may be used to implement other logic functions than the NOR gate of FIG. 1.
Figure 3:
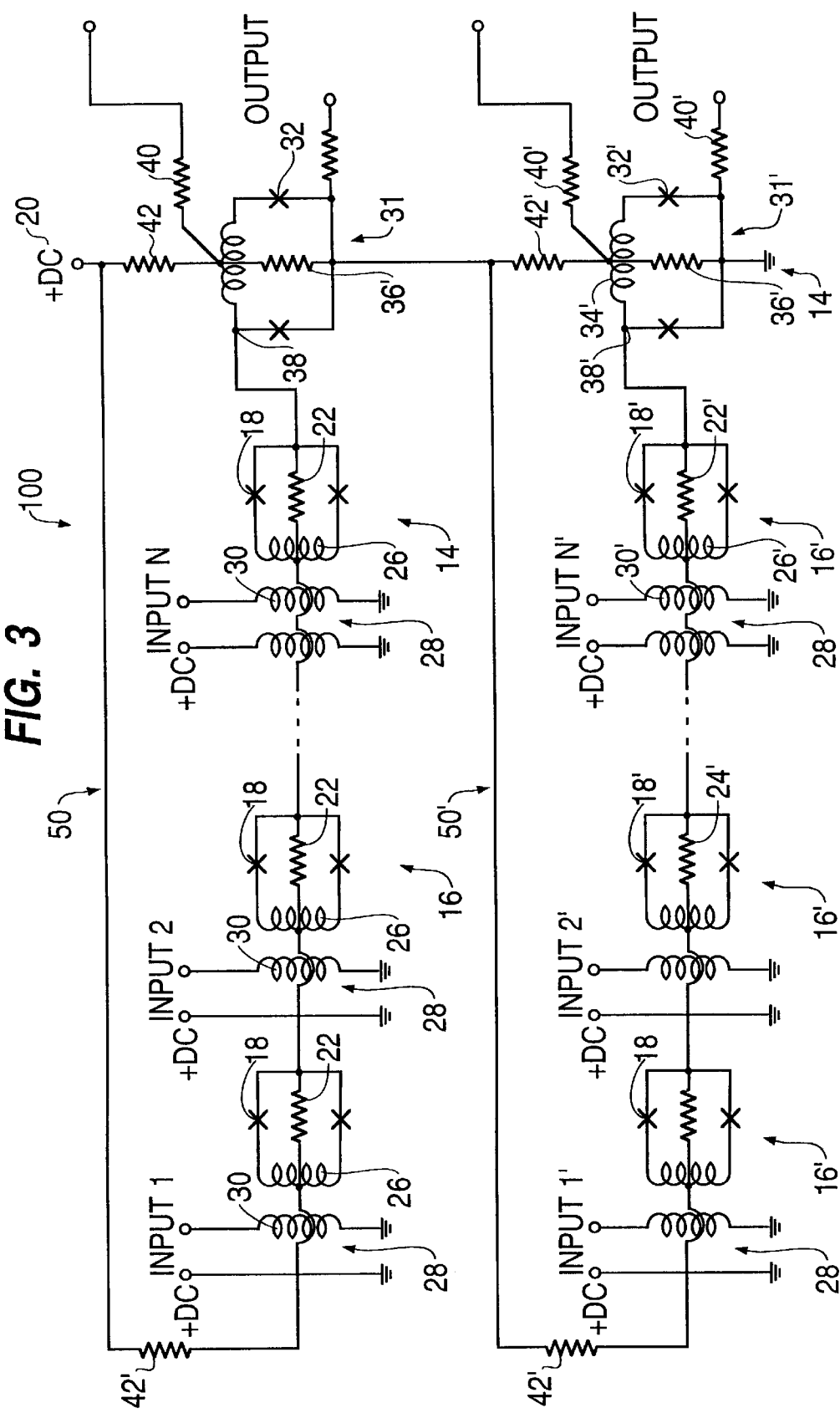
FIG. 3 illustrates a circuit schematic of another embodiment of the present invention in which a plurality of superconductive logic gate assemblies are connected with output circuits connected in series with the DC power supply.

The embodiments of FIGS. 2 and 3 have been shown to have a configuration of resistors 22 and resistors 36 and an output SQUID identical to FIG. 1B. However, it should be understood that the embodiments of FIGS. 2 and 3 will preferably have the configuration of FIG. 1A with individual resistors being associated with each Josephson junction and plural output SQUIDs 31. The additional resistors and output SQUIDs have been omitted to simplify illustration of the preferred embodiments of FIGS. 2 and 3.

FIG. 2 illustrates a logic gate assembly 50 which is a modification of the NOR gate 10 of FIG. 1 which permits logic functions other than a NOR function to be implemented. The difference between the NOR gate 10 of FIG. 1 and the logic gate assembly 50 of FIG. 2 is that optional inverters are added to one or more of the SQUIDS 16 of the logic gate circuit 12 to produce a different logic function. In FIG. 2, the INPUTS 1 and 2 are non-inverting inputs and INPUT N is an inverting input. Unlike the embodiments of FIGS. 1A and 1B, a pair of inputs are present for each SQUID 16 with one input being DC and the other input being the input signal from one of the INPUTS 1–N. When a nron-inverting function is present at an INPUT, the presence of a signal input on the INPUTS, such as INPUTS 1 and 2, functions in the same manner as in FIGS. 1A and 1B. The current flow from DC bias is not coupled to the SQUID and does not affect the logical operation. When an inverting function is present at an INPUT, such as INPUT N, the DC current is coupled to the SQUID and is sufficient to suppress the Ic of the SQUID 16. The presence of a signal input on the INPUT N functions to unsuppress in Ic of the SQUID 16. Therefore, the control line (the INPUTS 1–N) is logically inverted. A gate with all non-inverting INPUTS, in accordance with the embodiments 1A and 1B, provides a NOR function and a gate with all inverting inputs provides an AND function.

FIG. 3 illustrates another embodiment 100 of the present invention which has a pair of identical logic gate assemblies 50 including the same inverters as FIG. 2. The first and second logic gate circuits 50 and 50' are identical to the superconductive logic gate assembly of FIG. 2 except that the output SQUIDs 31 and 31' are connected in series between the DC power supply 20 and ground. This topology permits current to be recycled from one logic gate assembly to another logic gate assembly which results in a negligible total current requirement. The series configuration of the output SQUIDs 31 and 31' eliminates large isolation resistors between gates which reduces power consumption and supports several GHz. operation which characterizes Josephson junction applications.

Figure 4:
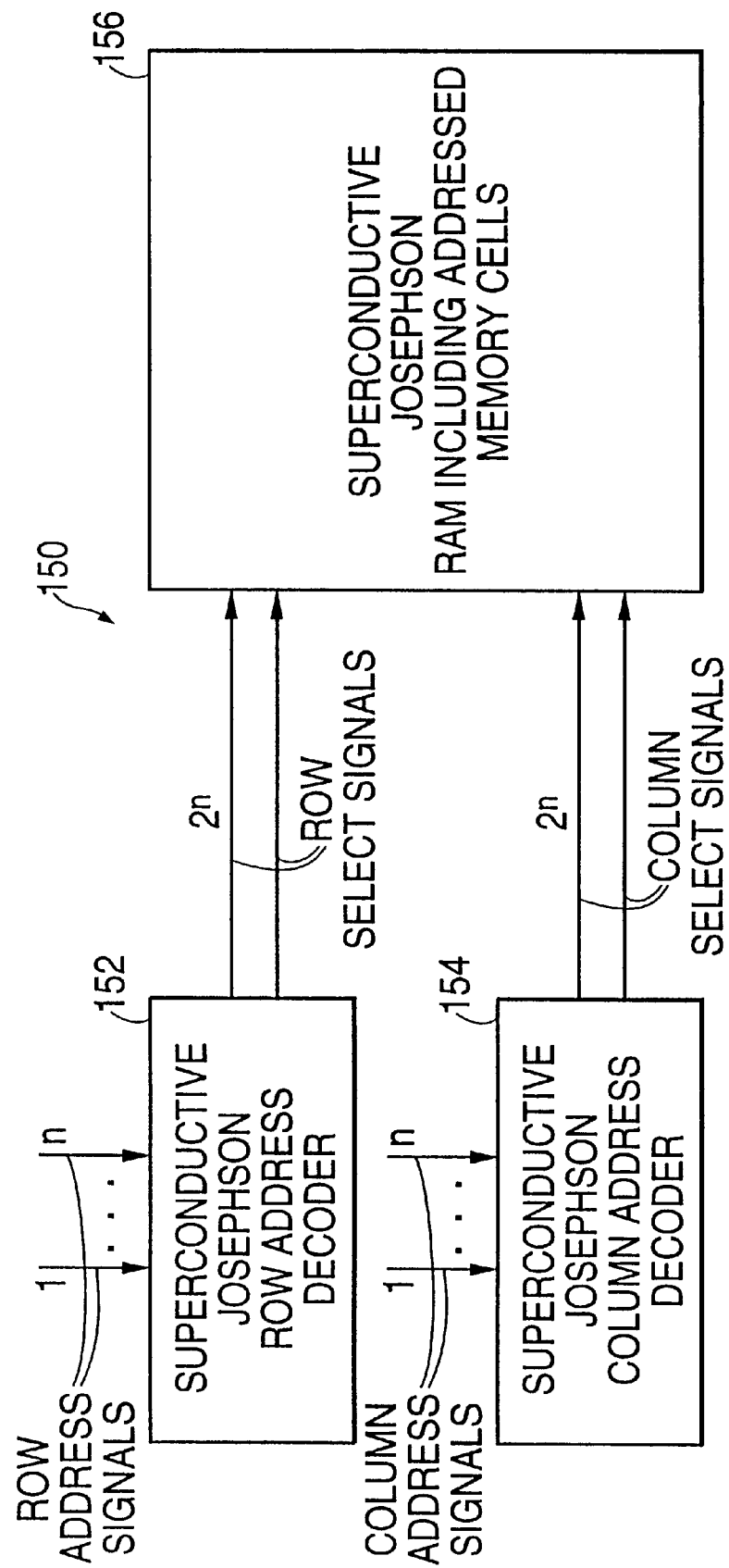
FIG. 4 illustrates a block diagram of a superconductive random access memory in accordance with the present invention in which the row and column address decoders utilize the NOR gate assembly of FIG. 1.

FIG. 4 illustrates a superconductive Josephson random access memory 150 in accordance with the present invention which includes a row address decoder 152 that converts row address signals into row select signals for selecting a row to be addressed in the random access memory and a column address decoder 154 that converts column address signals into column select signals for selecting a column to be addressed in the random access memory. As is well known, each of the decoders 152 and 154 responds to n inputs to provide selectivity of $2^n$ outputs which are identified as the row select and column select signals. The row address decoder 152 and the column address decoder 154 are superconductive and may be implemented with the NOR gate of FIG. 1. Normally, both the logical address signals and their complements are supplied to the NOR gate array. In the present circuit, however, complementary address signals can be generated internally where needed by inverting the NOR gate inputs (as described and shown in FIG. 2). Thus, complementary values need not be supplied externally. The row and column select signals are applied to a superconductive Josephson RAM including addressed memory cells 156 which is of conventional construction and utilizes Josephson junctions to operate in a superconductive state.

The superconductive random access memory 150 has access times below 1 nanosecond, provides cryogenic operation and zero power dissipation in a hold state. When utilized with the row address and column address decoders 152 and 154 implemented with the NOR gate of FIG. 1, the superconductive random access memory 150 reduces power and current requirements of the address decoder circuitry. This results in recycling of current between the row address decoder 152 and column address decoder 154 resulting in negligible total current being drawn.

While the invention has been described in terms of its preferred embodiments, it should be understood that numerous modifications may be made thereto without departing from the spirit and scope of the invention. It is intended that all such modifications fall within the scope of the appended claims.

What is claimed is:

1. A superconductive logic gate assembly comprising:
   a plurality of logic inputs, each logic input being coupled to a SQUID and each SQUID including a resistance which eliminates hysteresis in an output of the SQUID produced in responding to a change in signal level at the logic inputs to the SQUID;
   a DC bias coupled to each SQUID; and
   an output circuit coupled to each SQUID for providing a logic output in response to the logic inputs; and wherein
   each logic input is coulpled to a transformer through which electrical current flows between the logic input and a reference potential with the transformer coupling the input to the SQUID.

2. A superconductive logic gate assembly in accordance with claim 1 wherein:
   each transformer has a winding within the SQUID and the resistance in each SQUID is at least one resistor coupled to the winding and to Josephson junctions in the SQUID.

3. A superconductive logic gate assembly in accordance with claim 2 wherein:
   each resistor is coupled in a series circuit between the DC bias and the output circuit.

4. A superconductive logic gate assembly in accordance with claim 3 wherein:
   the output circuit comprises at least one output SQUID coupled between the DC bias and a reference potential with the at least one output SQUID including at least one output resistance which eliminates hysteresis in the logic output produced in response to a change in signal level at an input to the at least one output SQUID.

5. A superconductive logic gate assembly in accordance with claim 4 wherein:
   the output resistance is at least one resistor coupled between the DC bias and a reference potential and which provides critical damping in responding to a change in signal level at the input to the at least one output SQUID.

6. A superconductive logic gate assembly in accordance with claim 3 wherein:
   each SQUID is critically damped by the a least one resistor in responding to a change in signal level at a logic input to the SQUID.

7. A superconductive logic gate assembly in accordance with claim 2 wherein:
   the output circuit comprises at least one output SQUID coupled between the DC bias and a reference potential with the at least one output SQUID including at least one output resistance which eliminates hysteresis in the logic output produced in response to a change in signal level at an input to the at least one output SQUID.

8. A superconductive logic gate assembly in accordance with claim 7 wherein:
   the output resistance is at least one resistor coupled between the DC bias and a reference potential and which provides critical damping in responding to a change in signal level at the input to the at least one output SQUID.

9. A superconductive logic gate assembly in accordance with claim 2 wherein:
   each SQUID is critically damped by the at least one resistor in responding to a change in signal level at a logic input to the SQUID.

10. A superconductive logic gate assembly in accordance with claim 1 wherein:
    the output circuit comprises at least one output SQUID coupled between the DC bias and a reference potential with the at least one output SQUID including at least one output resistance which eliminates hysteresis in the logic output produced in response to a change in signal level at an input to the at least one output SQUID.

11. A superconductive logic gate assembly in accordance with claim 10 wherein:
    the output resistance is at least one resistor coupled between the DC bias and a reference potential and which provides critical damping in responding to a change in signal level at the input to the at least one output SQUID.

12. A superconductive logic gate assembly in accordance with claim 1 wherein:

each SQUID is critically damped by the resistance in responding to a change in signal level at a logic input to the SQUID.

13. A superconductive logic gate assembly comprising:
a plurality of logic inputs coupled to a logic gate circuit and an output circuit coupled to the logic gate circuit which, in response to logic input signals applied to the logic gate circuit, provides a logic output signal;
a DC bias coupled to the logic gate circuit; and wherein the output circuit includes a logic output which provides the logic output signal, the output circuit including at least one output SQUID coupled between the DC bias and a reference potential with the at least one output SQUID including at least one output resistance which eliminates hysteresis in the logic output signal produced in responding to a change in the signal level at an input to the at least one output SQUID; and
each logic input is coupled to a transformer through which electrical current flows between the logic input and a reference potential with the transformer coupling the input to the SQUID.

14. A superconductive logic gate assembly in accordance with claim 13 wherein:
the output resistance is at least one resistor coupled between the DC bias and the reference potential and which provides critical damping in responding to the change in signal level at the input to the at least one output SQUID.

15. A superconductive NOR gate assembly comprising:
a plurality of logic inputs, each logic input being coupled to an input SQUID and each input SQUID including an input resistance which eliminates hysteresis in an output of the input SQUID produced in responding to a change in logic level at the logic input to the input SQUID;
a DC bias coupled to each input SQUID;
each logic input being coupled to a transformer including a winding in a different input SQUID with the winding being coupled to the DC bias;
the input resistance of each input SQUID being coupled between the winding and a junction between at least two Josephson junctions with each resistance being coupled in a series circuit; and
an output circuit, the output circuit being coupled to the DC bias for producing an output signal which is a NOR function of the plurality of logic inputs and having at least one output SQUID coupled between the DC bias and a reference potential with the at least one output SQUID including at least one output resistance which eliminates hysteresis in the output signal produced in response to a change in signal level at an input to the at least one output SQUID.

16. A superconductive NOR gate assembly in accordance with claim 15 wherein:
the input and output resistances are respectively input and output resistors with the input resistors being coupled between the winding and the at least two Josephson junctions in each input SQUID and the at least one output resistor being coupled to the input resistors and to a reference potential.

17. A superconductive logic gate assembly comprising:
a plurality of logic inputs, each logic input being coupled to a SQUID with each of the SQUIDs of the plurality of logic inputting connected in series;
a DC bias coupled to each SQUID with only a single power lead connected to one SQUID of the plurality of logic inputs; and
an output circuit coupled to each SQUID for providing a logic output in response to the logic inputs.

18. A superconductive logic gate assembly in accordance with claim 17 wherein:
each logic input is coupled to a transformer through which electrical current flows between the logic input and a reference potential with the transformer coupling the input to the SQUID and each SQUID includes a resistance which eliminates hysteresis in an output of the SQUID produced in responding to a change in signal level at the logic inputs to the SQUID.

19. A superconductive logic gate assembly in accordance with claim 18 wherein:
each transformer has a winding within the SQUID and the resistance in each SQUID is at least one resistor coupled to the winding and to Josephson junctions in the SQUID.

20. A superconductive logic gate assembly in accordance with claim 19 wherein:
each resistor is coupled in a series circuit between the DC bias and the output circuit.

21. A superconductive logic gate assembly in accordance with claim 19 wherein:
each resistor is in parallel with a Josephson junction in each SQUID.

22. A superconductive logic gate assembly in accordance with claim 18 wherein:
each SQUID is critically damped by the resistance in responding to a change in signal level at a logic input to the SQUID.

23. A superconductive logic gate assembly in accordance with claim 17 wherein:
the output circuit comprises at least one output SQUID coupled between the DC bias and a reference potential with the at least one output SQUID including at least one output resistance which eliminates hysteresis in the logic output produced in response to a change in signal level at an input to the at least one output SQUID.

24. A superconductive logic gate assembly in accordance with claim 23 wherein:
the at least one output resistance is at least one resistor coupled between the DC bias and a reference potential and which provides critical damping in responding to a change in signal level at the input to the at least one output SQUID.

* * * * *